United States Patent [19]

Johnson

[11] Patent Number: 4,973,917

[45] Date of Patent: Nov. 27, 1990

[54] OUTPUT AMPLIFIER

[75] Inventor: William A. Johnson, Minneapolis, Minn.

[73] Assignee: Threepenney Electronics Corporation, Minneapolis, Minn.

[21] Appl. No.: 413,399

[22] Filed: Sep. 27, 1989

[51] Int. Cl.$^5$ .............................................. H03F 3/45
[52] U.S. Cl. ..................................... 330/259; 330/260
[58] Field of Search ............... 330/259, 260; 381/69.1, 381/121

[56] References Cited

U.S. PATENT DOCUMENTS

| | | | |
|---|---|---|---|
| 3,444,472 | 5/1969 | Johnson | 330/259 X |
| 3,731,215 | 5/1973 | Peil et al. | 330/259 X |
| 4,187,472 | 2/1980 | Yum | 330/260 |
| 4,752,744 | 6/1988 | Aoki | 330/260 X |

*Primary Examiner*—James B. Mullins
*Attorney, Agent, or Firm*—Kinney & Lange

[57] ABSTRACT

An output amplifier having a pair of controlled current generators each with an output impedance that is electrically connected to the other, a pair of output controllers each of which is across a corresponding one of the output impedances, and a pair of feedback impedances each connected from a corresponding one of the output controllers to a corresponding one of the controlled current generators. A differential amplifier is provided ahead of the controlled current generators with the amlifier input capacitively connected to the input of such differential amplifier. An offset adjuster is provided between the output impedances having its output connected to the capacitively connected differential amplifier input. A current feedback arrangement is provided between the output impedances and connected to the controlled current generators to be capable of altering currents generated thereby.

52 Claims, 3 Drawing Sheets

OUTPUT AMPLIFIER

BACKGROUND OF THE INVENTION

The present invention relates to amplifiers used at the end of a signal path for providing an amplified signal to an output device and, more particularly, to such amplifiers which are to operate with a low quiescent current and also be capable of operating with a low supply voltage.

There are many situations in which electronic circuits must operate with only a low supply voltage being available thereto. In battery operated equipment, particularly, not only is the supply voltage often low, but also minimizing power dissipation is very important to lengthen the life of the battery or batteries used. Yet some of these situations require an output amplifier circuit which can deliver a considerable amount of power to the load device, perhaps aided by some capacitive storage provided across the power supply.

In these circumstances, the output amplifier type is often chosen to be such that the output transistors therein carry little or no current in the absence of an input signal to the output amplifier stage. This minimizes power dissipation during such conditions to thereby reduce the drain on the power supply and so leads to improved amplifier efficiency in converting power from such a supply to signal power.

One type of equipment where this has become increasingly important is in hearing aids, these having begun as a chest-worn package of electronics with a lead to an output device worn in the ear. The next major change was to a behind-the-ear electronics package, and then to an in-the-ear package and, finally, to an in-the-canal package. The reduction in size of the electronics package, including the battery power supply, to make such a transition in the locations on their person at which users of such hearing aids carry that equipment is quite remarkable. Microphones, speakers or receivers, batteries and electronic circuitry have all undergone varied but quite significant size reductions to make this possible.

However, further reductions in the physical size of these various portions of a hearing aid are desirable to increase benefits to the users thereof. A major difficulty in reducing the geometrical volume of the associated electronic circuitry has been the number of external capacitors needed in connection with output amplifier, the remaining circuitry of which is provided in a monolithic integrated circuit chip. Although such capacitors have also been reduced in size, they together still present major difficulties in miniaturizing hearing aid packages sufficiently to be insertable into smaller ear canals. Thus, there is desired an output amplifier circuit requiring little quiescent current which is capable of being operated at a low supply voltage, and which, as formed in a monolithic integrated circuit chip, reduces the number of external capacitors required to be used therewith.

SUMMARY OF THE INVENTION

The present invention provides an amplifier having a pair of controlled current generating means each with an output impedance means that is electrically connected to the other, a pair of output controllers each of which is across a corresponding one of the output impedance means, and a pair of feedback means each connected from a corresponding one of the output controllers to a corresponding one of the controlled current generating means. The output impedance means of each of the controlled current generating means has a portion in each electrically in common with the other, and these output impedance means can have both substantially constant and variable currents flowing therethrough. The current controlled current generating means comprise an amplifying means and a feedback means. Each feedback impedance can be split and a further impedance coupled between the resulting junctions of the split feedback means. A differential amplifier is provided ahead of the current generating means with the amplifier input capacitively connected to the input of such differential amplifier. An offset adjustment means is provided between the output impedance means and having its output electrically connected to the capacitively coupled input of the differential amplifier. A current feedback means is provided between the output impedance means having its outputs connected to the current controlled current generating means to be capable of altering current generated thereby.

DETAILED DESCRIPTION OF THE PREFERRED EMBODIMENTS

Figure 1A:
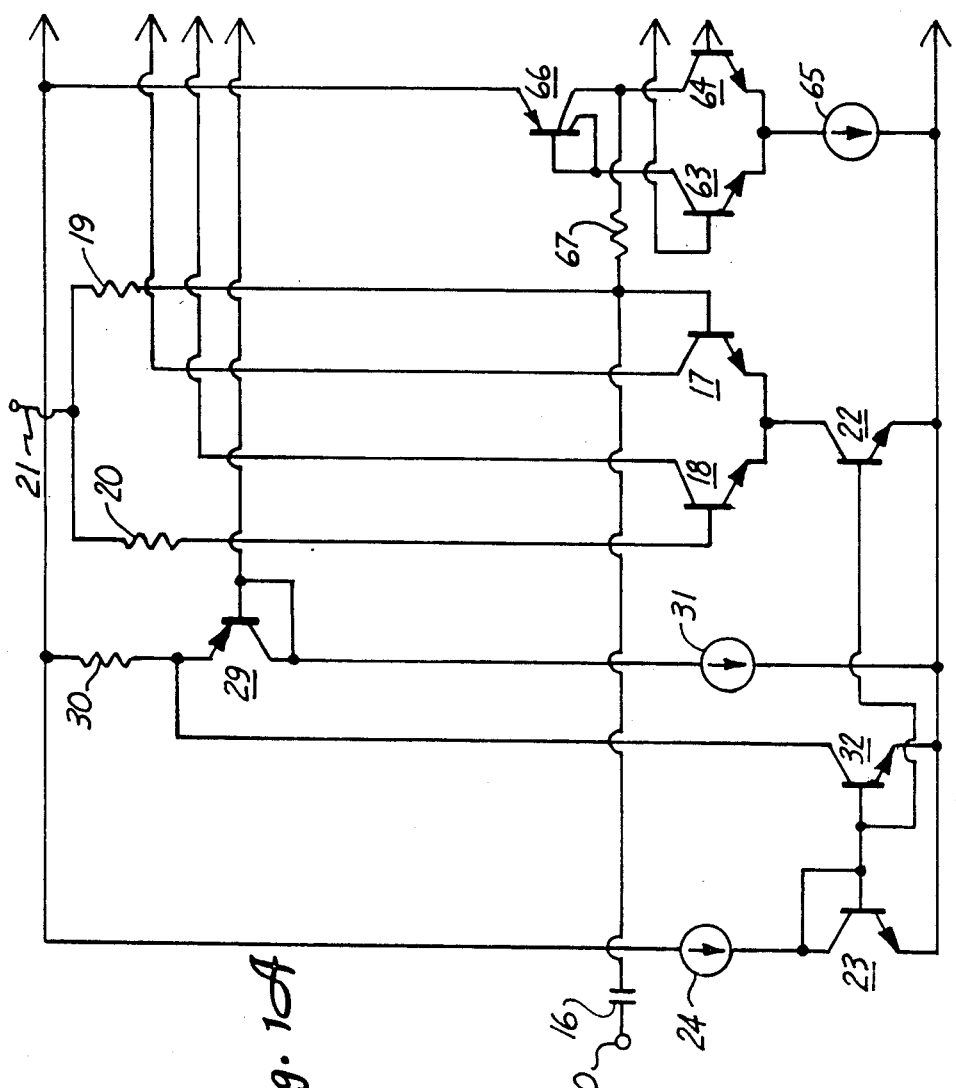
FIGS. 1A, 1B and 1C together show a circuit schematic diagram embodying the present invention.
Figure 1B:
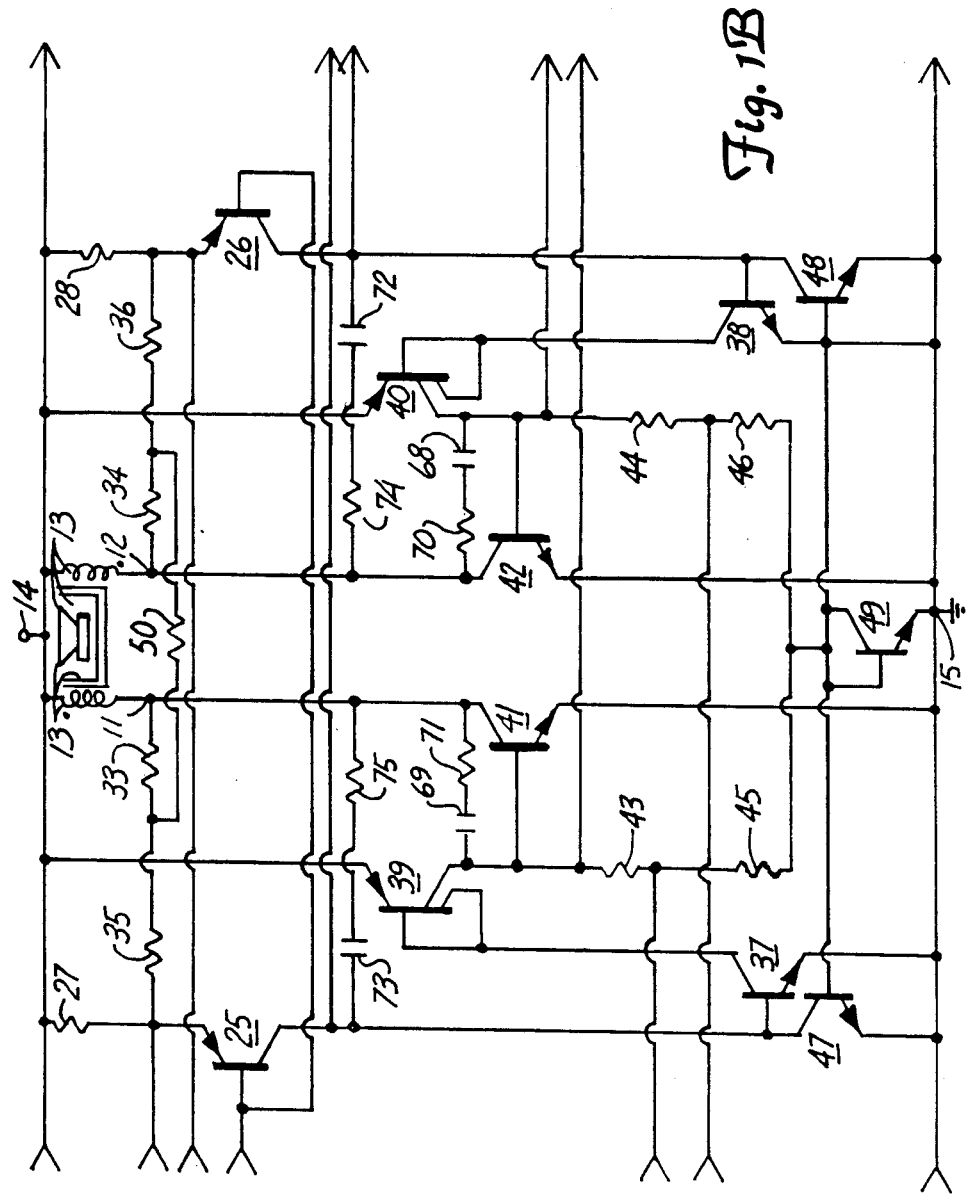
Figure 1C:
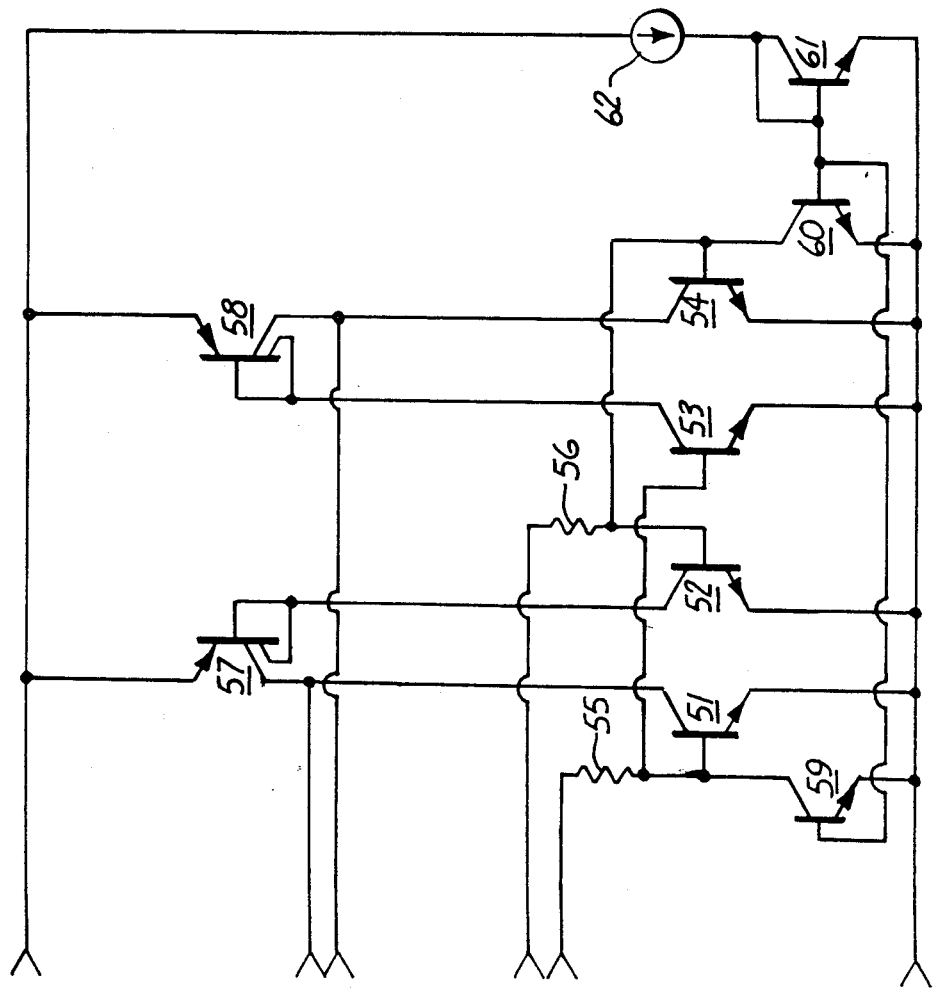

FIG. 1, including FIGS. 1A, 1B and 1C, shows a circuit schematic diagram of the output amplifier embodying the present invention. A signal input, 10, for this output amplifier is shown to the left in FIG. 1A. The output amplifier is shown in the upper part of FIG. 1B as having two output terminals, 11 and 12, with the output load being a center tapped coil of a miniature loudspeaker, or receiver, 13.

Loudspeaker 13 is shown having a permeable core magnetically coupling the two halves of the center tapped coil of that speaker to one another. The center tap of that coil is connected to terminal, 14, intended for connection to a source of positive voltage typically supplied from a battery, not shown, when the amplifier is used as part of the hearing aid. Such a battery will typically supply an output voltage over its life in a range of from 1.05 to 1.55 V. The other side of such a voltage source is intended for connection to a ground reference terminal, 15. The left-hand coil half of the center tapped coil in loudspeaker 13 is connected between positive voltage supply terminal 14 and amplifier output 11, and the right-hand half is connected between terminal 14 and amplifier output 12.

Signals to be amplified to operate loudspeaker 13 are provided to input 10 of the amplifier of FIG. 1, and from there are coupled through a capacitor, 16, which decouples the voltage levels about which such a signal is supplied by the source thereof from the voltage levels about which the input circuitry of the amplifier of FIG. 1 operates. Capacitor 16 is the only capacitor which must be supplied externally for the entirety of the amplifier shown in FIG. 1 due to the need of a capacitance value in excess of that which can be conveniently supplied as part of the monolithic integrated circuit chip in which the remaining parts of the output amplifier circuitry of FIG. 1 are typically provided. This need for only a single capacitor in the output amplifier circuit of FIG. 1 is distinguished from the more typical use of at least two additional capacitors to decouple normal voltage operating levels at the output of the amplifier from those at the input of the amplifier. This is done because of the usual need for feedback connections between the amplifier output and input to control system gain and to control the output impedance characteristics which arise from the use of an output loudspeaker such as loudspeaker 13.

Such loudspeakers have electrical characteristics which depend not only on the electrical materials present, but also on the mechanical construction of the load device and the acoustical surroundings in which such a device is placed. That is, the electrical impedance characteristic of the loudspeaker 13 will reflect therein mechanical structural resonances modified by, and perhaps added to by, resonances arising as a result of the acoustical impedance faced by loudspeaker 13. The occurrence of such resonances leads to uneven performance across the frequency range in which the system is to operate. Improvements in these resonance characteristics to reduce performance differences between different parts of the operating frequency spectrum of the system are usually obtained through the use of negative feedback from the amplifier output to some point earlier along the amplifier signal path.

The signals supplied at input 10 of the amplifier in FIG. 1A, coupled through capacitor 16, are applied to the base of an input differential amplifier having a pair of matched npn bipolar transistors, 17 and 18. Capacitor 16 has the side thereof opposite the one connected to input 10 connected to the base of transistor 17. Also connected to the base of transistor 17 is a bias resistor, 19. A bias resistor, 20, of similar value is correspondingly connected to the base of transistor 18. The other sides of bias resistors 19 and 20 are each connected to a terminal means, 21, adapted for connection to a well regulated supply of positive voltage. The value of this regulated positive voltage is typically chosen to be 0.925 V for the battery voltage values given above, and the source of that voltage is the positive voltage supply source connected to terminal 14 which is also connected to a voltage regulator circuit, not shown. The output of that voltage regulator circuit is then supplied to terminal 21.

The emitters of the input differential bipolar transistors 17 and 18 in FIG. 1A are connected to the collector of a further npn bipolar transistor, 22, having its emitter connected to ground reference terminal 15. The current drawn at the collector of transistor 22 is held at a carefully fixed, though selectable, value so that the input differential amplifier based on matched bipolar transistors 17 and 18 converts "single-ended" signals from input 10, those being signals typically provided there with respect to ground reference terminal 15, to differential signals at the collectors of those transistors.

The value of the current drawn through the collector of transistor 22 is set by a biasing arrangement therefor including a further npn bipolar transistor, 23, which is well matched to bipolar transistor 22 with the exception of having the collector area thereof being just twice that of transistor 23. Since the emitter of transistor 23 is also connected to ground reference terminal 15, and since the bases of transistors 22 and 23 are directly connected to one another so that the same voltage occurs across the base-to-emitter junction of each, this arrangement assures that the current drawn at the collector of transistor 22 will be just twice that drawn at the collector of transistor 23. The values of those currents are set by a current source, 24, having the current draw terminal thereof connected to terminal 14 and the current supply terminal thereof connected to the collector of transistor 23 and the bases of transistors 22 and 23. The collector of transistor 23 will draw all the current supplied by current source 24 beyond that required for the base thereof and the bases of the other transistors connected thereto which will be negligible if such transistors have high current gains. As a result, the collector of transistor 22 will essentially draw twice the current value supplied by current source 24. If transistors 17 and 18 are well matched, they will each draw approximately the same collector current in the absence of a signal at input 10 of the amplifier, and so the collectors of transistors 17 and 18 will each draw a current in this circumstance essentially equal to that supplied by current source 24.

The collectors of transistors 17 and 18 are each connected to the inputs of a corresponding one of a pair of current controlled current generating means, or controllers, shown in FIG. 1B and used to operate the output devices connected to the output amplifier outputs 11 and 12. Transistor 17 has its collector connected to the emitter of a pnp bipolar transistor, 25, and the collector of transistor 18 is connected to the emitter of another pnp bipolar transistor, 26. Also connected between positive voltage terminal 14 and the emitter of transistor 25 is a current level setting resistor, 27, and similarly, a current level setting resistor, 28, is connected between terminal 14 and the emitter of transistor 26.

Pnp bipolar transistor 25 and current level setting resistor 27 together form one of the output portions of a simple current mirror arrangement which is used to provide a current of a selected value at the collector of transistor 25 in the absence of an input signal at input terminal 10. This current mirror arrangement is, however, modified to alter such a current so supplied from that value which would occur as a result of it being set by the current mirror arrangement alone to values instead reflecting other input signals which are provided to this current mirror arrangement output portion. Similarly, pnp bipolar transistor 26 and current level setting resistor 28 are also another output portion of this current mirror arrangement for providing a selected current at the collector of transistor 26 in the absence of an input signal at input 10, but again this current mirror output portion is modified so that the current output therefrom will also reflect other input signals provided thereto.

The control portion of this current mirror arrangement which primarily sets the output portions' currents in the absence of an input signal at input 10 comprises a further pnp bipolar transistor, 29, and its current level setting resistor, 30, shown in the upper portion of FIG. 1A. Resistor 30 is connected between positive voltage terminal 14 and the emitter of transistor 29. The base of pnp bipolar transistor 29 is connected to its collector and to the bases of pnp bipolar transistors 25 and 26. A current source, 31, has its current draw terminal connected to the base and collector of transistor 29 and its current supply terminal connected to ground reference terminal 15.

Current source 31 draws a selected current from the collector and base of transistor 29 with the proportion drawn from each depending on its current gain. Transistor 29 and transistors 25 and 26 are well matched to one another and formed as lateral pnp bipolar transistors in the monolithic integrated circuit containing the circuitry for the output amplifier. Since the values of resistors 27 and 28 are equal to one another and to the value of resistor 30, the current drawn by current source 31 from transistor 29 will essentially match the total of the current supplied through the collectors and bases of each of transistors 25 and 26. However, because transistors 25, 26 and 29 are all lateral bipolar pnp transistors, the gains thereof often will be relatively low, and so the base currents drawn through each of these transistors will often not be negligible. Thus, the current supplied at the collectors of transistors 25 and 26 will often be significantly less than the current drawn by current source 31. On the other hand, since transistors in this current mirror arrangement are well matched, as are the current level setting resistors, the collector currents of transistors 25, 26 and 29 will be substantially equal insofar as they are set by the current mirror control portion circuitry involving transistor 29, resistor 30 and current source 31.

Of course, one of the other sources of signals operating the current mirror arrangement output portions in addition to the primary control portion of the current mirror arrangement circuit are the collector currents from transistors 17 and 18. Since these currents are substantially drawn through corresponding current level setting resistors 27 and 28, increases therein increase the voltage drops across those resistors and will lead to decreases in the collector currents of transistors 25 and 26 because of the relatively constant setting of the base voltages of those transistors by current level setting resistor 30 and the emitter-to-base voltage of transistor 29. Conditions in the current mirror output portions due to the drawing of such collector currents therein by the collectors of transistors 17 and 18 in the absence of an input signal at input 10 are kept similar to conditions in the primary control portion of this current mirror arrangement by drawing a similar current at the emitter of transistor 29 through a further npn bipolar transistor, 32. Npn bipolar transistor 32 is well matched with npn bipolar transistor 23, and has both its emitter and its base directly connected to those of transistor 23. As a result, the current drawn in the collector of transistor 32 is essentially equal to that supplied by current source 24. This current is drawn through resistor 30 as are similar currents from the collectors of transistors 17 and 18 drawn through resistors 27 and 28 in the absence of an amplifier input signal. Hence, in the absence of an input signal at input 10, voltage and current conditions at the emitters of transistors 25 and 26 are essentially the same as those at the emitter of transistor 29.

The provision of an input signal at input 10 of the output amplifier, however, causes differentials in the currents drawn at the collectors of transistors 17 and 18 which are superimposed upon the currents drawn there in the absence of an input signal at input 10. Thus, a positive signal at input 10 coupled through capacitor 16 to the base of transistor 17 will lead to an increased current drawn at the collector of transistor 17 substantially through resistor 27, and a decreased current drawn at the collector of transistor 18 drawn substantially through resistor 28. An opposite polarity signal at input 10 coupled through capacitor 16 to the base of transistor 17 will have the opposite result in the currents drawn through resistors 27 and 28.

Because the current controlled current generators are part of negative feedback loops, such differential signals occurring at the inputs thereof, the emitters of transistors 25 and 26, will be very nearly cancelled out by feedback signals supplied from outputs 11 and 12 of the output amplifier, respectively. Output signals at amplifier output 11 are applied to one end of a first feedback resistance, 33, shown in FIG. 1B, and output signals developed at output 12 of the output amplifier are applied to one end of the opposite side first feedback resistance, 34. The signals at output 11 applied to one end of resistor 33 are conducted therethrough and through a second feedback resistance, 35, which is connected in series with resistance 33 between it and the emitter of transistor 25 to which resistance 35 is also connected. Similarly, the output signals applied at output 12 to an end of resistor 34 are conducted through a second feedback resistance, 36, which is connected in series with resistance 34 by being provided between it and to the emitter of transistor 26 to which resistance 36 is also connected.

The difference between the change in the current drawn at the collector of transistor 17 because of a signal change at input 10 and the corresponding change in current fed back through resistors 33 and 35 will be drawn through the input of the current controlled generator on the left side of FIG. 1B, i.e. through the emitter of transistor 25, and will pass out the collector of that transistor. In the same manner, the difference between the accompanying current change drawn by the collector of transistor 18 and that corresponding current change supplied through resistors 34 and 36 will be drawn at the input of the current controlled generator on the right-hand side of the amplifier in FIG. 1B, that is, through the emitter of corresponding transistor 26, and out the collector thereof. Outputs 11 and 12 will be forced to voltage values sufficient to make these differences very small because of the substantial transimpedance values between these outputs and the current controlled current generator inputs. Thus, the gain characteristics of the output amplifier past the outputs of the input differential amplifier, at least at lower frequencies, are set primarily by resistors 33, 34, 35 and 36, although resistors 27 and 28 have some effect, and a further resistor has a significant effect as will be described below (as does a current feedback circuit also to be described below).

The differential increments and decrements in current at the collectors of pnp bipolar transistors 25 and 26 in response to a signal at input 10 of the output amplifier are applied to the remaining portions of the current controlled current generators. Current changes at the collector of transistor 25 are applied to the base of an npn bipolar transistor, 37, and corresponding changes in the current at the collector of transistor 26 are applied to the base of another npn bipolar transistor, 38, both shown in FIG. 1B. The emitters of transistors 37 and 38 are connected to ground reference terminal 15. The collector of transistor 37 is connected to the base of a pnp bipolar transistor, 39, and also to one of its two collectors. Similarly, the collector of transistor 38 is connected to the base of another pnp bipolar transistor, 40, and to one of its two collectors.

Transistors 39 and 40 are formed as lateral pnp transistors in the monolithic integrated circuit chip for the output amplifier. Each of these pnp transistors has a relatively large total collector area. The first collector of each of these transistors that is connected to its base has an area on the order of the collector area of the npn bipolar transistor also connected thereto, but the second and remaining collector of each has an area seven times that of the first collector thereof.

Since transistor 39 has its emitter connected to positive reference voltage terminal 14, it is in series with transistor 37 between positive voltage terminal 14 and ground reference terminal 15, as is the similar series combination of pnp transistor 40, also having its emitter connected to terminal 14, and npn transistor 38. The choice of a pnp transistor for each of transistors 39 and 40 in these arrangements rather than npn transistors allows the circuit to operate at lower voltages between terminals 14 and 15. This is important as a battery connected between those terminals begins to come toward the end of its life with its output voltage falling.

The result of these series arrangements is that, rather than two base-to-emitter voltage drops being required between terminals 14 and 15 which would be the situation if the collectors of transistors 37 and 38 were each connected to the base of another corresponding npn transistor, there is only one such base-to-emitter voltage drop between these terminals for each of npn transistors 37 and 38 plus the collector-emitter saturation voltage of the corresponding pnp transistor which is several tenths of a volt less than a base-to-emitter voltage drop. The relatively large collector areas taken by pnp bipolar transistors 39 and 40 aid in making the saturation voltage thereof relatively small. Similar series relationships between terminals 14 and 15, providing a minimum of a saturation voltage in series with a base-to-emitter voltage, occurs between transistors 25 and 37, and between transistors 26 and 38.

The second collector of transistor 39 is connected to the base of an output npn bipolar transistor, 41, and the second collector of transistor 40 is also connected to the base of another output npn bipolar transistor, 42. Since transistors 41 and 42 are output devices, they are also relatively large collector area transistors each having a collector area sixteen times that of the collector areas of transistors 37 and 38. As transistors 41 and 42 must be capable of conducting currents therethrough of up to 40 mA, the large collector areas of pnp bipolar transistors 39 and 40 are also advantageous in the event that the monolithic integrated circuit fabrication process happens to yield relatively low current gains for transistors 41 and 42. In that situation, substantial currents must be supplied to the second collectors of transistors 39 and 40 to force transistors 41 and 42 to conduct such a large collector current in each.

Through having the first collector of each of transistors 39 and 40 connected to its base, the maximum current gain of these transistors is fixed at seven. This arrangement is used to aid in the providing of a stable amplifier. Too high a gain in the left-hand current controlled current generator cascade of transistors 37, 39 and 41 and in the righthand generator cascade of transistors 38, 40 and 42 leads to feedback loop stability problems. Limiting the gain of the pnp transistors is an easier way to stabilize the loop as compared to providing a complicated compensation network for that loop. Further, too large a gain in the pnp transistors in these cascades, if coupled with large gains in the output npn transistors therein, leads to very small currents in the initial npn transistors in these cascades, transistors 37 and 38. Such very small currents therethrough make transistors 37 and 38 relatively slow which can also lead to feedback loop stability problems.

The current gains of these cascades will, of course, at sufficiently high currents be limited by saturation effects or by the diminishing of the current gain of the transistors at higher currents. At currents below the onset of such effects, these transistor cascades each exhibit very high current gains on the order of the current gains of each of the two npn transistors therein multiplied together and that result then multiplied by the current gain of the cascade pnp transistor, or seven.

The second collectors of each of pnp transistors 39 and 40 are also connected to one another through a string of series resistors as shown in FIG. 1B. Thus, there is a first resistor, 43, on the left side of FIG. 1B in this string connected directly to the second collector of transistor 39. A similar resistor, 44, is the first resistor in this string on the other side of that figure and is connected to the second collector of transistor 40. A second resistor, 45, in the resistor string on the left side of the figure is connected to a second resistor, 46, in the string on the right side of the figure, and these last two resistors are connected directly between resistors 43 and 44. A typical value for each of these resistors is 48 kΩ.

The junction of resistors 45 and 46 also has the bases of two further transistors connected thereto, each closing an inner feedback loop in the corresponding current controlled current generator on either side of FIG. 1B. Thus, a further npn bipolar transistor, 47, has its base connected to the junction of resistors 45 and 46, and its emitter connected to ground reference terminal 15. The collector of transistor 47 is connected to the base of transistor 37 to thereby close the inner feedback loop in the current controlled current generator on the left of that figure. Similarly, a further npn bipolar transistor, 48, has its base connected to the junction of resistors 45 and 46, and its emitter connected to ground reference terminal 15. Again, the inner feedback loop in the current controlled generator on the opposite side of the figure is closed by having the collector of transistor 48 connected to the base of transistor 38.

The closing of these two inner feedback loops thereby forms the two current controlled current generators, one on either side of the output amplifier portion shown in FIG. 1B. Thus, for the left side inner feedback loop, current supplied by the collector of transistor 25 is applied to the base of transistor 37, and a corresponding current is drawn through the base of transistor 39 by the collector of transistor 37. That current through the base of transistor 39 causes a current to flow through its second collector, which also flows through resistors 43 and 45, and partly into the base of transistor 47. This last current flow will be just enough to cause the collector of transistor 47 to draw almost all of the current supplied by the collector of transistor 25 as the high gain of this inner loop means only a slight current needs to be supplied to the base of transistor 37.

Some of the current supplied by the second collector of transistor 39 in this left side inner loop, in passing through resistors 43 and 45, also passes through a further npn bipolar transistor, 49. Transistor 49 has its base and collector connected to the junction of transistors 45 and 46, and its emitter connected to ground reference terminal 15 to thus be diode-connected therebetween. The current drawn at the collector of transistor 47 must be essentially that drawn at the collector of transistor 25 because of the high current gain in the loop formed by transistors 37, 41 and 47. Thus, an increment in current at the collector of transistor 25 will lead to a similar increment of current passing through the second collector of transistor 39, and through resistors 43 and 45 to ground through transistor 49.

Similarly, a change in current at the collector of transistor 26 is applied to the base of transistor 38 so that its collector draws a corresponding current from the base of pnp transistor 40. That current will be sufficient so that the current from its second collector, flowing through resistors 44 and 46 and then through transistor 49 and the base of transistor 48, will yield very nearly the same current being drawn at the collector of transistor 48 as was supplied from the collector of transistor 26 because of the high current gain around the loop formed by transistors 38, 40 and 48. Thus, this change in current at the collector of transistor 26 will be reflected in the change in current provided at the second collector of transistor 40. The presence of transistor 49 requires that half of the nominal current flowing in the collectors of transistors 25 and 26 will flow in series resistor combination 43 and 45 and in series resistor combination 44 and 46, respectively.

As can be seen, each of these current controlled current generators has an output impedance which drives the corresponding one of the npn output transistors 41 and 40, the emitters of which are connected to ground reference terminal 15. The one of these output impedances associated with the current controlled current generator on the left side of FIG. 1B includes resistors 43 and 45, and diode-connected transistor 49. On the right-hand side of that figure, the current controlled current generator there has an output impedance involving resistors 44 and 46 and diode-connected transistor 49. Hence, the output impedances of these two current controlled generators share a common circuit component, diode-connected transistor 49.

The change in current in the second collector of transistor 39, applied through the output impedance of the left side current controlled current generator, controls the current drawn at the collector of output npn transistor 41 since the base and emitter thereof are connected across the output impedance of that generator. Similarly, the base and emitter of npn output transistor 42 are connected across the output impedance of the right side current controlled current generator, and so current changes at the second collector of transistor 40 control the current drawn at the collector of transistor 42. The collector of transistor 41 is connected to output terminal 11 of the amplifier, and the collector of output transistor 42 is connected to output terminal 12 of the amplifier.

Feedback resistor 35 and feedback resistor 36, will each provide signal currents therethrough to the inputs of the corresponding current controlled current generator which very nearly cancel the signal currents drawn because of input signals on amplifier input 10 at the corresponding outputs of the input differential amplifier, the collectors of transistors 17 and 18, due to the negative feedback involved. Thus, the (a) remaining relatively steady currents flowing at the emitters of transistors 25 and 26, and so at the collectors thereof, as set by resistors 27 and 28 and by the steady currents drawn at the collectors of transistors 17 and 18 in the absence of signals at input 10, and the (b) steady currents drawn at the bases of transistors 25 and 26 due to current source 31, will together set the quiescent current flows in the collectors of output transistors 41 and 42. As described above, such current flows at the collectors of transistors 25 and 26 also flow in the second collectors of transistors 39 and 40. Since transistor 41 is well matched to transistors 47 and 49, with the exception of collector areas, the base current flowing through transistor 41 will be the base currents flowing in those two transistors plus an additional increment due to the higher base voltage on the base thereof because of the voltage drops across resistors 43 and 45. If the voltage drops that occur across these resistors are not large, the current drawn through transistor 41 in the absence of a signal at input 10 of the output amplifier would be approximately sixteen times that flowing in the collectors of transistors 47 and 49 because of the collector area of transistor 41 being sixteen times that of those transistors. A similar relationship occurs between transistor 42 and transistors 48 and 49 to set the quiescent current through transistor 42 for a similar assumption concerning the voltage drops across resistors 44 and 46.

The presence of transistor 49 increases the current drawn through resistors 43 and 45 on the left side of the amplifier portion shown in FIG. 1B and through resistors 44 and 46 on the right side of that amplifier portion, which increases the quiescent collector current through output transistors 41 and 42 as compared to the values that would flow therethrough otherwise which, as stated above, would be around sixteen times that flowing in the collectors of transistors 47 and 48, respectively. Thus, changing the values of the currents at the collectors of transistors 25 and 26 to change the quiescent currents in output transistors 41 and 42 will do so though not only because of a corresponding change in current at the second collector of transistors 39 and 40. Rather, in addition, the voltage drop across the corresponding current controlled current generator output impedance resistors in parallel with these output transistor base-to-emitter junctions will be added to the base-to-emitter voltage drop of transistor 49 across these output transistor junctions leading to an increased voltage drop thereacross applied against the exponential characteristic of such junctions to result in a significantly greater base current in each output transistor base.

Thus, a change in the collector current of transistor 47 because of a change in the collector current of transistor 25 comes about because of a very small voltage change across the base-to-emitter junction of transistor 47. A much larger voltage change across the base-to-emitter junction of transistor 41 will accompany that change across that junction of transistor 47 leading to a much larger change in quiescent current through transistor 41. Thus, a change in current at the collector of transistor 25 will yield a much larger change in the quiescent current through the collector of transistor 41.

This relationship means that a relatively small change is required in the voltage drop across resistor 27 in the emitter circuit of transistor 25 to cause a significant change in the quiescent current flowing through transistor 41. This result is important, since resistor 27 has to be fairly sizable if signals at input 10 of the operational amplifier affecting the collector currents of transistors 17 and 18 are to provide significant signals at the emitter of transistor 25 serving as the right current controlled current generator input based on these input signals. Yet, the voltage drop across resistor 27, to set the quiescent collector current flow through transistor 41, cannot be permitted to be very large if this output amplifier is to be usable with a relatively low value of supply voltage provided between voltage supply terminal 14 and ground reference terminal 15 as is necessary, for instance, in using a hearing aid battery for this purpose. Thus, resistor 27 has to be fairly large to permit good signal amplification, and yet must be in a circuit arrangement which allows a large adjustment of quiescent current value for different kinds of loudspeakers 13 without the occurrence of a large voltage drop thereacross. Hence, the exponential-like relationship between the quiescent collector current flow of output transistor 41 and the voltage drop across resistor 27 is a significant characteristic of this output amplifier. A similar relationship occurs between the voltage drop across resistor 28 and the quiescent current flow through the collector of output transistor 42.

Since output transistors 41 and 42 operate between the coil halves of loudspeaker 13, each connected to positive voltage terminal 14 on one side thereof and ground reference 15 on the other side, a signal current increase on one side of the output amplifier portion shown in FIG. 1B at either of amplifier outputs 11 or 12 cannot be balanced in the sense of supplying a similar current in the opposite direction through the other output. That is, each of output transistors 41 and 42 can either draw a current through its corresponding half of the loudspeaker 13 load in the "on" condition or go into the "off" condition—no significant current can be supplied by the opposite output transistor through the opposite side of the load if the first output transistor is on. The collectors of transistors 41 and 42 can operate between a positive voltage value and the ground voltage value as sinks of current through loudspeaker 13 coil halves, but they cannot become sources of current therethrough. Hence, nearly always, either transistor 41 or 42 is in the "off" condition while the other is in the "on" condition.

Yet, even in these circumstances, the bases of these output transistors must change both above and below a voltage value balance point if there is to be any output signal applied across any part of the output load formed by the coil of loudspeaker 13. That is, when one of the output transistors is in the "off" condition, the base voltage thereof must be the negative of the base voltage of the "on" condition transistor with respect to this voltage value balance point. In the absence of such a balanced change at the bases of one of transistors 41 and 42 by having the voltage at the base of one going above such a voltage value point while that of the other correspondingly goes below, the signals supplied to such bases would appear as a common mode signal which would be eliminated by the feedback in the current controlled current generators leaving no signal across the output load coil.

Thus, an increase in the current at the collector of transistor 25 must be accompanied by a decrease in the current at the collector of transistor 26, i.e. operate differentially, if there is to be a resultant signal across load coil of loudspeaker 13. Otherwise, an increase in collector current for transistor 25, leading to an increase in current at the second collector of transistor 39, would not only tend to increase the current at the base of transistor 41, but would also tend to increase the current at the base of transistor 42 through resistors 43, 45, 46 and 44. The resulting increase in voltage at the junction of resistors 45 and 46 would be sensed by the bases of transistors 47 and 48 and, as a result, be cancelled out jointly by each of them to thus eliminate any significant change in the collector currents of output transistors 41 and 42. This would result in no substantial signal across any part of the output load coil of loudspeaker 13.

If, however, the voltage at the junction of resistors 45 and 46 stays constant through any change in voltage across resistors 43 and 45 being balanced by a corresponding opposite change in voltage across resistors 44 and 46, there will be no change in voltage at the junction of resistors 45 and 46 to be sensed by either of transistors 47 or 48. As a result, one of output transistors 41 and 42 would have the collector current therethrough increased and the remaining one of these output transistors would be forced towards the "off" condition.

Such a differential signal result at the bases of output transistors 41 and 42 is supplied, of course, by the differential output signals of the input differential amplifier based on transistors 17 and 18 in response to input signals at amplifier input 10. This is the only source of this result for load halves between positive voltage terminal 14 and amplifier outputs 11 and 12 which do not directly interact with one another, such as for resistive loads being provided between positive voltage terminal 14 and amplifier outputs 11 and 12. For load halves which are directly interactive, such as the coil halves in loudspeaker 13 formed on a common permeable material core, the interactive coupling will also enter into the differential action for the coil winding directions shown in FIG. 1B, and will result in the output voltage at times rising above that supplied at terminal 14. A further aid in this regard is the current feedback circuitry provided in this output amplifier which is shown primarily in FIG. 1C and will be described below.

This need for having voltage on the base of one of output transistors 41 and 42 change in value in the opposite direction from that of the other about the voltage value at the junction of resistors 45 and 46 requires choosing in effect a sufficient quiescent collector current through output transistors 41 and 42. That is, a sufficient current flow through the current controlled current generator output impedance resistors 43 and 45 the left side of the amplifier portion in FIG. 1B and the current controlled current generator output impedance resistors 44 and 46 on the opposite side is needed so that such changes about the voltage at the junction of resistors 45 and 46 can be accommodated.

The lower the load impedance, the higher the output transistor quiescent currents must be since the currents flowing through resistors 43 and 45 and through resistors 44 and 46, which set these output transistor quiescent currents, must also be greater to provide a sufficient range of voltage values for such changes in the voltages at the bases of the output transistors 41 and 42 without clipping occurring. The lower the impedance occurring in the load, the greater the current changes therethrough must be to provide sufficient signals to operate that load, and so greater changes are required in the voltages at the bases of output transistors 41 and 42.

The capability to reduce the voltage on a base of one of the output transistors 41 and 42 below that occurring at the junction of resistors 45 and 46 comes about because of the selectable value currents drawn at these bases by the current feedback circuitry of FIG. 1C which is described below. The larger the currents drawn at the output transistor bases by the current feedback circuitry, the greater the currents which must be supplied through the second collectors of transistors 39 and 40 to raise the voltages sufficiently across the series resistors 43 and 45 and across the series resistors 44 and 46 to be able to supply the current feedback circuitry demand. The larger voltage drop across these series resistor combinations accommodates the need for allowing the output transistor voltages to drop below the voltage value balance point at the junction of resistors 45 and 46, as a reduction in the current at either of the second collectors of transistors 39 or 40 will not support the current demand of the feedback circuitry resulting in a reduction of the voltage across the corresponding series resistor combination to being below that voltage point. This larger voltage drop across these series resistor combinations also increases the quiescent currents in the output transistors.

In the feedback circuitry, the current value setting therein which increases the current drawn thereby at the bases of the output transistors to accommodate symmetrical voltage changes about the voltage at the junction of resistors 45 and 46 to thereby permit larger output current changes for smaller impedance loads also sets the amount of current feedback. This is possible since a reduced amount of current feedback giving less amplifier gain attenuation is needed in these same circumstances.

At relatively low values of amplifier gain (which is set by the combination of choices for the value of the current in current source 24, the value of a current setting in the current feedback to be described, and the values of the various feedback resistors) and something greater than minimum loudspeaker impedances, very small quiescent currents are all that are required. In those circumstances, the amplifier distortion will be dominated by that occurring in the input differential amplifier. This distortion will be just that characteristic of two-transistor differential amplifiers, and will be a maximum as the input differential amplifier just goes into saturation. For higher gains, the distortion will diminish as this gain will be supplied by the remainder of the amplifier past the input differential amplifier, and so this input differential amplifier will be operated with lower signal values therein reducing its distortion.

A further resistor, 50, is provided connected between the junction of feedback resistors 33 and 35, and the junction of feedback resistors 34 and 36. Resistor 50 reduces the current required to be shifted by the input differential amplifier based on transistors 17 and 18 in response to a changed input signal at amplifier input 10 to thereby achieve a corresponding voltage value shift at outputs 11 and 12 of the output amplifier of a given magnitude, i.e. resistor 50 increases the gain of the amplifier. Since smaller current shifts are required in the input differential amplifier based on transistors 17 and 18 because of the presence of resistor 50, a smaller quiescent current can be used therein, as set by transistors 22 and 23 with current source 24, and so a smaller standby current drain for the output amplifier as a whole can be achieved.

Thus, if the signal applied at input 10 of the output amplifier causes an increase in the current drawn by the collector of transistor 17, there will be a corresponding decrease in the current drawn at the collector of transistor 18. As a result, there will be a tendency toward an increase in the voltage drop across resistor 27 and a tendency toward a decrease in the voltage drop across resistor 28. Because of the negative feedback connection, there will be a corresponding increase in the voltage at output 11 of the amplifier and a corresponding decrease in the voltage at output 12 thereof tending to nullify these changes in currents drawn at the collectors of transistors 17 and 18.

However, the voltage at node 11 will have to rise further, and the voltage at node 12 will have to fall further, than it would in the absence of resistor 50 since current will be removed from the junction of resistors 33 and 35 by resistor 50 and supplied to the junction of resistors 34 and 36. The increase in voltage at output 11 will be required to supply not only the current needed to nullify the added current drawn at the collector of transistor 17, but to also supply the current being drawn through resistor 50 due to the lowered voltage at output 12. Thus, a greater voltage differential will occur between outputs 11 and 12 by the presence of resistor 50 than would otherwise occur for a change in differential currents at the collectors of transistors 17 and 18 in the input differential amplifier. Hence, that presence provides a clear increase in the gain of the output amplifier because of resistor 50.

Thus, the output voltage differential between outputs 11 and 12 in response to a differential change in currents drawn at the collectors of transistors 17 and 18 of the input amplifier depends not only on the values of the feedback resistors 33 through 36, and the resistance values of the bias resistors 27 and 28, but also on the resistance value of resistor 50. This gain, or transimpedance, of the output amplifier portion shown in FIG. 1B can be expressed as follows assuming symmetrically positioned resistors have equal values:

$$\text{Transimpedance} = \frac{v_{12} - v_{11}}{i_{17} - i_{18}} = R_A + R_B - R_C + 2\frac{R_A R_B}{R_D}$$

In this equation, $R_A = R_{35} = R_{36}$, $R_B = R_{33} = R_{34}$, $R_C = R_{27} = R_{28}$, and $R_D = R_{50}$. Typical values of these resistances are $R_A = R_B = R_D = 48$ k$\Omega$ and $R_C = 8$ k$\Omega$ (as does resistor 30 earlier noted to have a value equal to that of resistors 27 and 28). As can be clearly seen from this equation, decreasing the value of resistor 50, or $R_D$, clearly increases the transimpedance of the amplifier portion shown in FIG. 1B. The feedback resistor resistance values are relatively large so the current conducted by them in the absence of an input signal at input 10 will be small and unimportant insofar as the setting of the quiescent current in output transistors 41 and 42 is concerned.

The limit on the changes in currents which can be drawn at the collectors of transistors 17 and 18 in the input differential amplifier determines the maximum output possible of the output amplifier at its outputs 11 and 12 if these outputs have not reached the saturation limits set by the voltage on terminal 14 (ignoring inductive transients). The current set by transistors 22 and 23 in conjunction with current source 24 for this input differential amplifier determines the maximum range of current change possible at the collectors of transistors 17 and 18. This range is equal to a maximum value of the current drawn by transistor 22 if one of transistors 17 and 18 draws all of that current at its collector, and to a value of zero if the other of those transistors draws all that current at its collector. Thus, the maximum differential in the current being drawn at the collectors of transistors 17 and 18 is equal to the current set to be drawn by transistor 22. This current substituted in the above equation gives as a result the maximum voltage differential which can be provided between outputs 11 and 12 in the absence of current feedback and in the absence of these outputs reaching the saturation limit provided by the voltage on terminal 14. This maximum voltage differential in these circumstances determines the maximum voltage which can occur across the coils of loudspeaker 13. No greater voltage can occur since there is no further increase possible in the current differential between the currents drawn at the collectors of transistors 17 and 18.

As a result, the output voltage change of the output amplifier is effectively limited to a maximum value set by the input differential amplifier if the maximum current change of that amplifier is kept sufficiently small to avoid having the limit be set by output saturation effects because of the voltage provided on terminal 14. This is accomplished without the need to include any added component solely for the purpose of providing such a limit for the maximum excursion of that voltage. The absence of any such excursion limiting components avoids current drains therethrough in those situations in which the output amplifier is driven into saturation, which is likely to happen in a hearing aid arrangement for example, as external acoustical energy ranges will on occasion be greater than the range of permissible inputs to keep the amplifier within its operating range at its output. Since there are no output range excursion limiting components, there is nothing added to the feedback loops involved which could create any instability in the operation thereof. Further, reaching the voltage change limit is done rather gracefully compared to the use of output excursion limiting devices and, as a result, there is likely to be much less harsh output signal components generated in reaching the output limits of the output amplifier by this method.

As noted above, there can be rather significant changes in the output impedance presented by loudspeaker 13 over the desired operating frequency range due to electromechanical and acoustical resonances associated with that speaker. The lower loudspeaker impedance values which occur over some parts of the output operating frequency range will lead to a much greater output current being drawn at those frequencies unless such low impedance values are counteracted in some manner. The manner used here is to provide current feedback in the output amplifier as the means of compensating such low impedance values in the impedance characteristic provided by loudspeaker 13 to outputs 11 and 12 of the output amplifier. Such current feedback is provided by the circuitry shown primarily in FIG. 1C.

Of course, the parts of the load impedance characteristic over frequency exhibited by loudspeaker 13 having high impedance values would cause much greater output voltages at outputs 11 and 12 if not counteracted. However, this is counteracted by the use of voltage feedback, and this voltage feedback is supplied by the feedback resistors described above.

As previously described, the currents from the second collectors of pnp bipolar transistors 39 and 40 supply the control currents for output npn bipolar transistors 41 and 42 in FIG. 1B. Some of this current at the second collector of transistor 39 is carried through resistors 43 and 45, and the base and collector of transistor 49, across which together is provided the base-to-emitter junction of output transistor 41. Similarly, such current from the second collector of transistor 40 is carried through resistors 44 and 46, and through the base and collector of transistor 49, across which together is the base-to-emitter junction of output transistor 42. As a result, the voltage drops at the bases of these output transistors are a clear indicator as to the collector currents drawn by them, and so these voltage drops are sensed by the current feedback circuitry of FIG. 1C by pairs of collector coupled npn bipolar transistors as the basis for determining the magnitude of the feedback signals to be supplied in view of the collector currents magnitudes so sensed.

This method of sensing the output transistor collector currents avoids placing any components in series with the output transistors, such as resistors, as the basis for sensing the currents therethrough as often done and which would limit the possible output voltage range. Avoiding such a limitation is important if a low output voltage value voltage source such as a hearing aid battery is provided between positive voltage terminal 14 and ground reference terminal 15.

The voltage sensed at the base of output transistor 41 is applied to the base of an npn bipolar transistor, 51, in the first of these sensing transistor pairs, and the voltage at the base of output transistor 42 is applied to the base of a further npn bipolar transistor, 52, also in the first of these sensing pairs. Similarly, the voltage at the base of output transistor 41 is also applied to the base of an npn bipolar transistor, 53, in the second of these sensing transistor pairs, and the voltage at the base of output transistor 42 is again applied to a second npn bipolar transistor, 54, in the second sensing transistor pair. The voltage at the base of output transistor 41 so applied to the bases of transistors 51 and 53 is applied through a resistor, 55. Similarly, the voltage at the base of output transistor 42 applied as described to the bases of transistors 52 and 54 is applied through another resistor, 56.

The emitters of each of transistors 51 through 54 are directly connected to ground reference terminal 15. The first sensing pair of transistors has the collectors of transistors 51 and 52 therein connected to a two-collector pnp bipolar transistor, 57. The base of transistor 57 is connected to the first collector thereof and to the collector of transistor 52. The second collector of transistor 57 is connected to the collector of transistor 51, and to the collector of transistor 25 to serve as the output of this first sensing pair arrangement in the current feedback circuit. This first sensing pair output provides or draws a feedback current in the left side current controlled current generator of the output amplifier portion shown in FIG. 1B at the collector of transistor 25. The two collectors in each of transistors 57 and 58 each have substantially equal areas in the monolithic integrated circuit construction thereof. The emitter of transistor 57 is connected to positive reference voltage terminal The second sensing pair in the current feedback circuit involving transistors 53 and 54 has the collectors of those transistors connected to another two-collector pnp bipolar transistor, 58. The base of transistor 58 is connected to its first collector and to the collector of transistor 53. The second collector of transistor 58, serving as the output of this second sensing pair arrangement, is connected to the collector of transistor 54 and to the collector of transistor 26. This second sensing pair output provides or draws a feedback current in the right side current controlled current generator of the output amplifier portion shown in FIG. 1B at the collector of transistor 26. The emitter of transistor 58 is connected to positive reference voltage terminal 14.

If base currents for transistors 51 through 54 are all that are drawn through resistors 55 and 56, the currents in the collectors of those transistors, since they are well matched to output transistors 41 and 42 except for collector areas, will match the currents flowing in the collectors of transistors 41 and 42 though reduced by a factor of sixteen. This factor of sixteen is due to the differing collector areas in transistors 41 and 42 compared to those of transistors 51 through 54. If the current at the collector of transistor 25 is increased and that at the collector of transistor 26 is decreased due to a signal change at input 10 of the amplifier, there will be an increase in the current flowing in the collector of transistor 41 and an increase in the currents flowing in the collectors of transistors 51 and 53. There will be a corresponding decrease in the current in the collector of transistor 42 to very little current, and a similar decrease in the currents in the collectors of transistors 52 and 54 to again very little current.

As a result, the very small or negligible current in the collector of transistor 52 will mean little current flows in the base of transistor 57 and so very little current will flow in the collectors thereof. On the other hand, the current increase drawn at the collector of transistor 51 will be supplied from the collector of transistor 25 tending to nullify the increase in current at that collector which started the just described process. On the other hand, the significant increase in current at the collector of transistor 53 will lead to substantial currents flowing in the collectors of transistor 58. Since little or a negligible amount of current will be drawn in the collector of transistor 54, the current in the second collector of transistor 58 will be supplied to the base of transistor 38 to compensate for the earlier drop in current at the collector of transistor 26 to thereby counteract such a drop. Current changes at the collectors of transistors 25 and 26 in the opposite direction will lead to the opposite results.

Hence, the current feedback circuit of FIG. 1C tends to counteract current changes at the collectors of transistors 25 and 26, and will nearly nullify them in a situation where no significant current is drawn through resistors 55 and 56. This will be too much feedback in many situations resulting in too great an attenuation of the amplifier gain or transimpedance, and so the circuit in FIG. 1C has provisions for reducing this level of feedback. The collector of a further npn bipolar transistor, 59, is connected to the bases of transistors 51 and 53 and to resistor 55. Similarly, another npn bipolar transistor, 60, has its collector connected to the bases of transistors 52 and 54 and to resistor 56. The emitters of both of transistors 59 and 60 are connected to ground reference terminal 15. The bases of transistors 59 and 60 are each connected to a diode-connected bipolar transistor, 61, having its emitter connected to ground reference terminal 15 and its collector connected to its base. A current source, 62, is connected between positive reference voltage terminal 14 and the collector of transistor 61 to set the current carried therethrough.

Transistors 59 and 60 are well matched with transistor 61, and so the base currents flowing in transistors 59 and 60 will be essentially that flowing in the base of transistor 61. In these circumstances, the collector currents at transistors 59 and 60 will be essentially that at transistor 61, which for transistors with substantial current gain will be essentially the current supplied by current source 62. Since currents drawn at the collectors of transistors 59 and 60 must be supplied through resistors 55 and 56, a significant voltage drop can be caused to form thereacross so that the voltage changes at the bases of transistors 41 and 42 will be applied to transistors 51 through 54 at lower values on their base-to-emitter characteristics. This will have the effect of reducing the response of the collector currents of transistors 51 through 54 and so reduce the level of feedback signals applied at the collectors of transistors 25 and 26.

The current supplied by current source 62 can thus be set to provide any level of feedback desired and to significantly change the gain of that part of the output amplifier shown in FIG. 1B. In these circumstances, the equation given above for the transconductance of that portion of the output amplifier must be modified to take into account the action of the current feedback circuit shown in FIG. 1C to provide an accurate characterization of the behavior of that portion of the circuitry.

Note that the current feedback circuit of FIG. 1C draws increased current from the bases of output transistors 41 and 42 as the current value of current source 62 is increased. Thus, as indicated above, the current setting choice in the current feedback circuitry made by choosing the value of source 62 decreases the amplifier gain attenuation due to the current feedback circuit concurrently with increasing voltage drops across resistors 55 and 56 through drawing greater currents from the second collectors of transistors 39 and 40, respectively. This result, as described above, assures that the base voltages of the output transistors will be able to swing symmetrically about the value of the voltage occurring at the junctions of resistors 45 and 46 to avoid the elimination of an output signal due to common mode effects. The larger currents in the second collectors of transistors 39 and 40 allow greater changes to be made in these currents so larger voltage changes can be made across resistors 55 and 56. Correspondingly larger voltage charges can occur across the series combination of resistors 43 and 45 and across series resistor combination 44 and 46, respectively.

The two sides of the output amplifier portion shown in FIG. 1B are part of a negative feedback arrangement as explained above. In such situations, seemingly, the voltage feedback present would assure that the currents in the collectors of output transistors 41 and 42 in the absence of input signals at output amplifier input 10 would stay substantially equal in value. However, this feedback provision is not always adequate to assure such current matching because some kinds of output loads, including some kinds of loudspeakers 13, can have very low impedances therein with a resistive component that is on the order of only a few ohms per side. As a result, even relatively large current differentials between the collector currents of output transistors 41 and 42 may lead to only negligible voltage differences occurring at outputs 11 and 12 of the output amplifier.

To counter such current offsets, an offset differential amplifier is provided which is shown in FIG. 1A based on a pair of npn bipolar transistors, 63 and 64. The emitters of transistors 63 and 64 are connected together and to a current source, 65, at the current draw terminal thereof. The current supply terminal of current source 65 is connected to ground reference terminal 15. A two-collector pnp bipolar transistor, 66, has its base and its first collector connected together and to the collector of transistor 63, and has its second collector connected to the collector of transistor 64. Each of the collectors of transistor 66 has an area equal to that of the other. The emitter of transistor of 66 is connected to positive voltage terminal 14. A resistor, 67, connects the collector of transistor 64 to the base of transistor 17 in the input differential amplifier as well as to side of input capacitor 16 connected to that base.

The base of transistor 63 is connected to the junction of the series combination of resistors 43 and 45, and the base of transistor 64 is connected to the junction of the series combination of resistors 44 and 46 to sense the voltage difference between these two series resistor combination junctions. The voltage divider action of series combination resistors 43 and 45, and the voltage divider action of series combination resistors 44 and 46, provides voltage difference equal to half the voltage difference occurring between the bases of output transistors 41 and 42. This difference in voltage between the bases of output transistors 41 and 42 is, as explained above, a measure of the differential in the currents at the collectors of these two transistors in the absence of an input signal at input 10 of the output amplifier. The use of the two series resistor combinations as voltage dividers to supply signals to the bases of transistors 63 and 64 reduces the sensitivity of the circuit by two to avoid too much of a reaction to such imbalances by the offset differential amplifier.

If the voltage differential between the bases of transistors 63 and 64 leads to a voltage occurring on the base of transistor 63 greater than that occurring on the base of transistor 64, there will be a greater current drawn through the collector of transistor 63 and so through the base and first collector of transistor 66. There will be a similar increase in current supplied at the second collector of transistor 66 part of which will be added to the current flowing through resistor 67 as the current drawn at the collector of transistor 64 is correspondingly reduced. A voltage differential in the opposite direction on the bases of transistors 63 and 64 will lead to a smaller current being drawn from the base and first collector of transistor 66, and so a smaller current will be supplied at the second collector of transistor 66. Yet, a greater will be current drawn at the collector of transistor 64 leading to a current being drawn through resistor 67. The maximum magnitude of any current shifts permitted through resistor 67 for a differential voltage occurring between the junction of series combination resistors 43 and 45 and the junction of series combination resistors 44 and 46 will be set primarily by the value of the current drawn by current source 65 from the emitters of transistors 63 and 64.

Assuming that the opposite side of a source of signals connected to input 10 of the output amplifier has a ground reference connection, the current supplied through resistor 67 will supply charge which will be stored on capacitor 16 and the current drawn therethrough will remove such charge. The resulting voltage changes across input capacitor 16 applied to the base of transistor 64 will change the relationship of the collector currents in transistors 63 and 64, and so in transistors 17 and 18, to thereby correct imbalances in the collector currents drawn through output transistors 41 and 42.

The currents supplied to and drawn from capacitor 16 through resistor 67 will often change rapidly and abruptly as the two sides of the output amplifier portion shown in FIG. 1B have the corresponding output transistors thereof go from the "off" condition to the "on" condition and back again. This rapidly and sharply changing signal can be provided at the input of the input differential amplifier on top of that supplied by the input signal source at input 10, and yet not cause distortion of any significance, by keeping the currents supplied and drawn through resistor 67 to no more than being only large enough to change the voltage across resistor 19, or capacitor 16, sufficiently to compensate to a satisfactory extent the expected imbalances. Since no more than a 2 mV change across that resistor is expected to be needed, the maximum current needed to be supplied through resistor 67 is on the order of 40 nA for the component values chosen. This small current will be relatively negligible in showing up in the signal to be amplified in the output amplifier if the impedance of capacitor 16 and the source connected to input terminal 10 of the output amplifier is much less than the value of the resistance of resistor 19.

A typical resistance value for resistors 19 and 20 is 48 kΩ for each, with capacitor 16 having a typical capacitance value of 0.015 μF. A typical value for resistor 67 is 100 kΩ, and current source 65 typically has a value of 40 nA. In addition, the gain of the output amplifier must not be so high that excursions occurring in the voltages at the bases of transistors 41 and 42 become so great that they cause the signal supplied by the offset differential amplifier based on transistors 63 and 64 to be of a magnitude comparable to that of the signals supplied at input 10 of the output amplifier. The component values chosen for the offset circuitry are such that current mismatches in the collectors of the output transistors are not fully counteracted but are corrected sufficiently that the differences in currents drawn to the collectors of transistors 41 and 42 in the absence of an input signal at output amplifier 10 are kept from being too different from one another.

Because the quiescent currents flowing in output transistors 41 and 42 are kept as small as possible, there will as a result be large and rapid voltage excursions which occur at the bases thereof as the opposite sides of the amplifier portion shown in FIG. 1B go from the "off" condition to the "on" condition and back. This action, of course, is necessary for satisfactory, distortionless amplifier operation. Stabilization measures for the output amplifier must not inhibit this action by having a filtering effect on the operating signals supplied at the bases of transistors 41 and 42 even though the use of stabilization networks always involves the showing of some signal activity in an amplifier. This need is met here by using stabilization networks which establish the dominant pole of the amplifier characteristic at its output transistors so that the signals applied to the bases thereof have not been undesirably changed before being so applied. As a result of this location, the pole in the amplifier characteristic will change with the value of the load impedance.

In view of these considerations, a pair of series resistance and capacitance circuit branches are provided between the collector and base of each of output transistors 41 and 42 to establish the dominant pole of the output amplifier frequency response. Thus, a capacitance, 68, is connected to the second collector of transistor 40, and a further capacitance, 69, is connected to the second collector of transistor 39. A resistance, 70, is connected between capacitance 68 and the collector of transistor 42. Similarly, a resistance, 71, is connected between capacitance 69 and the collector of transistor 41. Placing these series resistance and capacitance circuits in these locations avoids affecting the signal paths from the inputs of the current controlled current generators to the bases of output transistors 41 and 42 so that the higher frequency components in those signals reach the bases of these transistors. Thus, the lower frequency portions are fully supplied to the bases of transistors 41 and 42 to experience the full gain of the amplifier, and only at frequencies above those at which the pole is located is there significant attenuation of the signals applied to the bases of transistors 41 and 42. This also reduces "crossover" distortion. The primary pole is set at a frequency of 3 kHz for the lowest impedance kind of coil for loudspeaker 13 based on resistors 70 and 71 having a resistance value of 15 kΩ, and capacitances 68 and 69 having values of 100 pF which can be easily provided in the monolithic integrated circuit containing most of the output amplifier circuitry.

A second pole is provided by another pair of resistance and capacitance series circuit branches. Thus, a capacitance, 72, is connected to the collector of transistor 26, and a similar capacitance, 73, is connected to the collector of transistor 25. A resistance, 74, is connected between capacitance 72 and the collector of output transistor 42. Another resistance, 75, is connected between capacitance 73 and the collector of output transistor 41. Typical resistance value for resistors 74 and 75 is 100 kΩ, and typical capacitance value for capacitors 72 and 73 is 33 pF, which can again be easily provided in the monolithic integrated circuit in which most of the output amplifier is formed.

The npn bipolar transistors used in the circuit of FIG. 1 in monolithic integrated circuit form all have the same design construction and are reasonably well matched to one another with the exception of differences in collector areas thereof, as has already been indicated. Similarly, the pnp bipolar transistors in that circuit are all constructed in the same manner in the monolithic integrated circuit with the exception of the number of collectors, again as has been indicated, and so are reasonably well matched to one another. The resistors in the monolithic integrated circuit are formed by ion implantation in the monolithic integrated circuit chip, and have the junctions therearound reverse biased. In addition, in fabricating such a monolithic integrated circuit, a separate ground return is desirable to use from the circuit components which are to conduct relatively high current values to eliminate noise problems in the ground reference interconnections to which components conducting currents of much lower values are connected.

Although the present invention has been described with reference to preferred embodiments, workers skilled in the art will recognize that changes may be made in form and detail without departing from the spirit and scope of the invention.

What is claimed is:

1. An amplifier having an input and a pair of outputs which is operable with a relatively small quiescent current therethrough and with a relatively small voltage drop thereacross, said amplifier comprising:

first and second controlled current generating means each having an input of which one is electrically connected to said amplifier input and each having an output impedance means with at least part of said output impedance means of each being common to one another, said first and second controlled current generating means each being capable, if electrically energized, of providing both substantially constant and variable currents through its said output impedance means of values depending on corresponding values of currents selected to be established through said input thereof; first and second output controller means each having first and second terminating regions and having a control region therein by which it is capable of being directed, through electrical energization thereof, to effectively provide a conductive path of a selected conductivity between its first and second terminating regions, said first and second output controller means first terminating regions each serving as one of said amplifier outputs, said first output controller means control region and second terminating region being electrically connected across said first controlled current generating means output impedance means and said second output controller means control region and second terminating region being electrically connected across said second controlled current generating means output impedance means; and first and second feedback impedance means each having first and second terminating regions, said first and second feedback impedance means first terminating regions each being electrically connected to a corresponding one of said first and second output controller means first terminating regions, said first and second feedback impedance means second terminating regions each being electrically connected to a corresponding one of said first and second controlled current generating means inputs.

2. The apparatus of claim 1 wherein there is further provided a differential amplifier means having an input electrically connected to said amplifier input, and having a pair of outputs at which signals are provided having differences in value therebetween that are representative of those differences in values occurring between signals provided to that differential amplifier means input and at least one other selected value, said differential amplifier means outputs each being electrically connected to a corresponding one of said first and second controlled current generating means inputs.

3. The apparatus of claim 2 wherein there is further provided an offset adjustment means having a pair of inputs each of which is electrically connected to a corresponding one of said first and second controlled current generating means output impedance means, and having an output which is electrically connected to said differential amplifier means, said offset adjustment means being capable of adjusting relative values of currents in said differential amplifier means outputs in response to currents flowing in said first and second controlled current generating means output impedance means.

4. The apparatus of claim 3 wherein said offset adjustment means is formed by a differential transconductance amplifier having an output serving as said offset adjustment means output and having a pair of inputs serving as said offset adjustment means pair of inputs.

5. The apparatus of claim 4 wherein said differential amplifier means input is electrically connected to said amplifier input through a capacitive means with said differential transconductance amplifier output being electrically connected to said differential amplifier means input.

6. The apparatus of claim 5 wherein said first and second controlled current generating means output impedance means has that portion thereof common to each formed by a diode means, and each has an independent impedance means separate from one another electrically connected in series with said diode means with each said independent impedance means formed of a pair of series impedance means electrically connected in series with one another at a common node at which a corresponding one of said offset adjustment means inputs is also electrically connected.

7. The apparatus of claim 2 wherein said differential amplifier means input is in an initial input and said differential amplifier means also has an alternative input to which is supplied a signal having said other selected value.

8. The apparatus of claim 7 wherein said differential amplifier means initial input is electrically connected to said amplifier input through a capacitive means.

9. The apparatus of claim 2 wherein said differential amplifier means input is electrically connected to said amplifier input through a capacitive means.

10. The apparatus of claim 1 wherein there is further provided a loudspeaker means having first and second inductive coil portions each having first and second terminals at opposite ends thereof which, in having currents therethrough, cause said loudspeaker to emit representative sounds, said first and second coil portions first terminals each being electrically connected to a first terminal means adapted for electrical connection to a first source of voltage, said first and second coil portion second terminals each being electrically connected to a corresponding one of said amplifier outputs.

11. The apparatus of claim 10 wherein said first and second coil portions are electrically connected in series so that a current increase therethrough leads to voltage drops across each which add rather than cancel in forming that voltage drop resulting across that series combination.

12. The apparatus of claim 1 wherein there is further provided a current feedback means having a pair of inputs each of which is electrically connected to a corresponding one of said first and second controlled current generating means output impedance means, and having a pair of outputs electrically connected to a corresponding one of said first and second controlled current generating means, said current feedback means being capable of causing said first and second controlled current generating means to alter values of currents occurring through said first and second controlled current generating means output impedance means in response to currents occurring in those said output impedance means.

13. The apparatus of claim 12 wherein said current feedback means comprises first and second current diverters each having an output corresponding to one of said current feedback means outputs and each having a pair of inputs with corresponding ones of these said inputs from each of said current diverters together serving as a corresponding one of said current feedback means inputs.

14. The apparatus of claim 13 wherein first and second current diverters each comprise a controlled current source means having an output and an input by which it is capable of being directed, through electrical energization thereof, to provide currents at its said output of values depending on corresponding values of currents selected to be established through said input thereof, and a controlled current sink means having an output and an input by which it is capable of being directed, through electrical energization thereof, to draw currents at its said output of values depending on corresponding values of currents selected to be established through said input thereof, said first and second current diverters each having its controlled current source means output and its controlled current sink means output together serving as its output and each having its controlled current source means input and its controlled current sink means input serving as its pair of inputs with opposite inputs in each said pair of inputs being in correspondence with one another.

15. The apparatus of claim 14 wherein said first and second controlled current generating means each comprise an amplifying means having an input and an output, and a feedback means having first and second terminating regions and having a control region therein by it is capable of being directed, through electrical energization thereof, to effectively provide a conductive path of a selected conductivity between its first and second terminating regions, said first and second controlled current generating means each having its independent impedance means electrically connected between its amplifying means output and its feedback means control region, and each having its feedback means first terminating region electrically connected to its amplifying means input and to a corresponding one of said current feedback means pair of outputs and having its feedback means second terminating region electrically connected to said diode means.

16. The apparatus of claim 15 wherein said first and second controlled current generating means each has its said feedback means first terminating region electrically connected also to its said input through an isolation means having first and second terminating regions and having a control region therein by it is capable of being directed, through electrical energization thereof, to effectively provide a conductive path of a selected conductivity between its first and second terminating regions, said first and second controlled current generating means each having its said isolation means control region electrically connected to a corresponding bias means capable of being directed to establish a selected electrical energization thereof, and having its said isolation means first terminating region electrically connected to its input, and also having its said isolation means second terminating region electrically connected to its feedback means first terminating region.

17. The apparatus of claim 1 wherein said first and second controlled current generating means output impedance means has that portion thereof common to each formed by a diode means.

18. The apparatus of claim 13 wherein said first and second controlled current generating means output impedance means each have an independent impedance means separate from one another that is electrically connected in series with said diode means.

19. The apparatus of claim 1 wherein there is further provided first and second bias means each having first and second terminating regions, said first and second bias means first terminating regions each being electrically connected to a first terminal means adapted for connection to a first source of voltage, said first bias means second terminating region being electrically connected to said first controlled current generating means input and said second bias means second terminating region being electrically connected to said second controlled current generating means input.

20. The apparatus of claim 19 wherein said first and second controlled current generating means output impedance means has that portion thereof common to each formed by a diode means, and each has an independent impedance means separate from one another electrically connected in series with said diode means.

21. The apparatus of claim 20 wherein said first and second controlled current generating means each comprise an amplifying means having an input and an output, and a feedback means having first and second terminating regions and having a control region therein by it is capable of being directed, through electrical energization thereof, to effectively provide a conductive path of a selected conductivity between its first and second terminating regions, said first and second controlled current generating means each having its independent impedance means electrically connected between its amplifying means output and its feedback means control region, and each having its feedback means first terminating region electrically connected to its input and its amplifying means input and having its feedback means second terminating region electrically connected to said diode means.

22. The apparatus of claim 21 wherein said first and second controlled current generating means each has its said feedback means first terminating region electrically connected to its said input, as aforesaid, through an isolation means having first and second terminating regions and having a control region therein by it is capable of being directed, through electrical energization thereof, to effectively provide a conductive path of a selected conductivity between its first and second terminating regions, said first and second controlled current generating means each having its said isolation means control region electrically connected to a corresponding bias means capable of being directed to establish a selected electrical energization thereof, and having its said isolation means first terminating region electrically connected to its input, and also having its said isolation means second terminating region electrically connected to its feedback means first terminating region.

23. The apparatus of claim 1 wherein said first and second feedback impedance means are each formed of a pair of series impedance means electrically connected in series with one another at a common node with opposite ends of each said pair of series impedance means serving as said first and second terminating regions of that one of said first and second feedback impedance means of which it is a part, and wherein there is further provided a symmetrical impedance means having a pair of terminating regions each of which is connected to a corresponding one of said common nodes provided in said first and second feedback impedance means.

24. The apparatus of claim 23 wherein there is further provided a loudspeaker means having first and second inductive coil portions each having first and second terminals at opposite ends thereof which, in having currents therethrough, cause said loudspeaker to emit representative sounds, said first and second coil portions first terminals each being electrically connected to a first terminal means adapted for connection to a first source of voltage, said first and second coil portion second terminals each being electrically connected to a corresponding one of said amplifier outputs.

25. The apparatus of claim 23 wherein there is further provided first and second bias means each having first and second terminating regions, said first and second bias means first terminating regions each being electrically connected to a first terminal means adapted for connection to a first source of voltage, said first bias means second terminating region being electrically connected to said first controlled current generating means input and said second bias means second terminating region being electrically connected to said second controlled current generating means input.

26. The apparatus of claim 25 wherein there is further provided a loudspeaker means having first and second inductive coil portions each having first and second terminals at opposite ends thereof which, in having currents therethrough, cause said loudspeaker to emit representative sounds, said first and second coil portions first terminals each being electrically connected to a terminal means adapted for connection to a first source of voltage, said first and second coil portion second terminals each being electrically connected to a corresponding one of said amplifier outputs.

27. An amplifier having an input and a pair of outputs which is operable with a relatively small quiescent current therethrough and with a relatively small voltage drop thereacross, said amplifier comprising:

first and second control means each having an input of which one is electrically connected to said amplifier input, and each having an amplifying means having an input and an output, and a feedback means having first and second terminating regions and having a control region therein by it is capable of being directed, through electrical energization thereof, to effectively provide a conductive path of a selected conductivity between its first and second terminating regions, said first and second control means each having a first impedance means electrically connected between its amplifying means output and its feedback means control region, and each having its feedback means first terminating region electrically connected effectively to its input and its amplifying means input and having its feedback means second terminating region electrically connected to a first terminal means adapted for electrical connection to a first source of voltage, said control regions of said feedback means of each of said first and second control means being electrically connected to one another such that current, substantially constant or variable, can flow therebetween;

first and second output controller means each having first and second terminating regions and having a control region therein by which it is capable of being directed, through electrical energization thereof, to effectively provide a conductive path of a selected conductivity between its first and second terminating regions, said first and second output controller means first terminating regions each serving as one of said amplifier outputs, said first output controller means control region being electrically connected to said first control means amplifying means output and said second output controller means control region being electrically connected to said second control means amplifying means output, said first and second output controller means second terminating regions each being electrically connected to said first terminal means; and first and second feedback impedance means each having first and second terminating regions, said first and second feedback impedance means first terminating regions each being electrically connected to a corresponding one of said first and second output controller means first terminating regions, said first and second feedback impedance means second terminating regions each being electrically connected to a corresponding one of said first and second control means inputs.

28. The apparatus of claim 27 wherein there is further provided a differential amplifier means having an input electrically connected to said amplifier input, and having a pair of outputs at which signals are provided having differences in value therebetween that are representative of those differences in values occurring between signals provided to that differential amplifier means input and at least one other selected value, said differential amplifier means outputs each being electrically connected to a corresponding one of said first and second control means inputs.

29. The apparatus of claim 28 wherein there is further provided an offset adjustment means having a pair of inputs each of which is electrically connected to a corresponding one of said first and second control means first impedance means, and having an output which is electrically connected to said differential amplifier means, said offset adjustment means being capable of adjusting relative values of currents in said differential amplifier means outputs in response to currents flowing in said first and second control means first impedance means.

30. The apparatus of claim 29 wherein said offset adjustment means is formed by a differential transconductance amplifier having an output serving as said offset adjustment means output and having a pair of inputs serving as said offset adjustment means pair of inputs.

31. The apparatus of claim 30 wherein said differential amplifier means input is electrically connected to said amplifier input through a capacitive means with said differential transconductance amplifier output being electrically connected to said differential amplifier means input.

32. The apparatus of claim 27 wherein there is further provided a loudspeaker means having first and second inductive coil portions each having first and second terminals at opposite ends thereof which, in having currents therethrough, cause said loudspeaker to emit representative sounds, said first and second coil portions first terminals each being electrically connected to a second terminal means adapted for electrical connection to a second source of voltage, said first and second coil portion second terminals each being electrically connected to a corresponding one of said amplifier outputs.

33. The apparatus of claim 32 wherein said first and second coil portions are electrically connected in series so that a current increase therethrough leads to voltage drops across each which add rather than cancel in forming that voltage drop resulting across that series combination.

34. The apparatus of claim 27 wherein there is further provided a current feedback means having a pair of inputs each of which is electrically connected to a corresponding one of said first and second control means amplifying means outputs, and having a pair of outputs electrically connected to a corresponding one of said first and second control means amplifying means inputs, said current feedback means being capable of providing current to, or diverting current from, said first and second control means amplifying means inputs in response to currents occurring through corresponding ones of said first and second control means amplifying means outputs.

35. The apparatus of claim 34 wherein said current feedback means comprises first and second current diverters each having an output corresponding to one of said current feedback means outputs and each having a pair of inputs with corresponding ones of these said inputs from each of said current diverters together serving as a corresponding one of said current feedback means inputs.

36. The apparatus of claim 35 wherein first and second current diverters each comprise a controlled current source means having an output and an input by which it is capable of being directed, through electrical energization thereof, to provide currents at its said output of values depending on corresponding values of currents selected to be established through said input thereof, and a controlled current sink means having an output and an input by which it is capable of being directed, through electrical energization thereof, to draw currents at its said output of values depending on corresponding values of currents selected to be established through said input thereof, said first and second current diverters each having its controlled current source means output and its controlled current sink means output together serving as its output and each having its controlled current source means input and its controlled current sink means input serving as its pair of inputs with opposite inputs in each said pair of inputs being in correspondence with one another.

37. The apparatus of claim 27 wherein a diode means is electrically connected between said first and second control means feedback means control regions and said first terminal means.

38. The apparatus of claim 27 wherein there is further provided first and second bias means each having first and second terminating regions, said first and second bias means first terminating regions each being electrically connected to a second terminal means adapted for connection to a second source of voltage, said first bias means second terminating region being electrically connected to said first control means input and said second bias means second terminating region being electrically connected to said second control means input.

39. The apparatus of claim 27 wherein said first and second feedback impedance means are each formed of a pair of series impedance means electrically connected in series with one another at a common node with opposite ends of each said pair of series impedance means serving as said first and second terminating regions of that one of said first and second feedback impedance means of which it is a part, and wherein there is further provided a symmetrical impedance means having a pair of terminating regions each of which is connected to a corresponding one of said common nodes provided in said first and second feedback impedance means.

40. The apparatus of claim 39 wherein there is further provided a loudspeaker means having first and second inductive coil portions each having first and second terminals at opposite ends thereof which, in having currents therethrough, cause said loudspeaker to emit representative sounds, said first and second coil portions first terminals each being electrically connected to a second terminal means adapted for connection to a second source of voltage, said first and second coil portion second terminals each being electrically connected to a corresponding one of said amplifier outputs.

41. The apparatus of claim 39 wherein there is further provided first and second bias means each having first and second terminating regions, said first and second bias means first terminating regions each being electrically connected to a second terminal means adapted for connection to a second source of voltage, said first bias means second terminating region being electrically connected to said first control means input and said second bias means second terminating region being electrically connected to said second control means input.

42. The apparatus of claim 27 wherein said first and second control means each has its said feedback means first terminating region electrically connected to its said input, as aforesaid, through an isolation means having first and second terminating regions and having a control region therein by it is capable of being directed, through electrical energization thereof, to effectively provide a conductive path of a selected conductivity between its first and second terminating regions, said first and second control means each having its said isolation means control region electrically connected to a corresponding bias means capable of being directed to establish a selected electrical energization thereof, and having its said isolation means first terminating region electrically connected to its input, and also having its said isolation means second terminating region electrically connected to its feedback means first terminating region.

43. An amplifier having an input and a pair of outputs which is operable with a relatively small quiescent current therethrough and with a relatively small voltage drop thereacross, said amplifier comprising:

first and second controlled current generating means each having an input of which one is electrically connected to said amplifier input and each having an output impedance means, said first and second controlled current generating means each being capable, if electrically energized, of providing both substantially constant and variable currents through its said output impedance means of values depending on corresponding values of currents selected to be established through said input thereof;

first and second output controller means each having first and second terminating regions and having a control region therein by which it is capable of being directed, through electrical energization thereof, to effectively provide a conductive path of a selected conductivity between its first and second terminating regions, said first and second output controller means first terminating regions each serving as one of said amplifier outputs, said first output controller means control region and second terminating region being electrically connected across said first controlled current generating means output impedance means and said second output controller means control region and second terminating region being electrically connected across said second controlled current generating means output impedance means; and a current feedback means having a pair of inputs each of which is electrically connected to a corresponding one of said first and second controlled current generating means output impedance means, and having a pair of outputs electrically connected to a corresponding one of said first and second controlled current generating means, said current feedback means being capable of causing said first and second controlled current generating means to alter values of currents occurring through said first and second controlled current generating means output impedance means in response to currents occurring in those said output impedance means.

44. The apparatus of claim 43 wherein said current feedback means comprises first and second current diverters each having an output corresponding to one of said current feedback means outputs and each having a pair of inputs with corresponding ones of these said inputs from each of said current diverters together serving as a corresponding one of said current feedback means inputs.

45. The apparatus of claim 44 wherein first and second current diverters each comprise a controlled current source means having an output and an input by which it is capable of being directed, through electrical energization thereof, to provide currents at its said output of values depending on corresponding values of currents selected to be established through said input thereof, and a controlled current sink means having an output and an input by which it is capable of being directed, through electrical energization thereof, to draw currents at its said output of values depending on corresponding values of currents selected to be established through said input thereof, said first and second current diverters each having its controlled current source means output and its controlled current sink means output together serving as its output and each having its controlled current source means input and its controlled current sink means input serving as its pair of inputs with opposite inputs in each said pair of inputs being in correspondence with one another.

46. The apparatus of claim 43 wherein there is further provided a differential amplifier means having an input electrically connected to said amplifier input, and having a pair of outputs at which signals are provided having differences in value therebetween that are representative of those differences in values occurring between signals provided to that differential amplifier means input and at least one other selected value, said differential amplifier means outputs each being electrically connected to a corresponding one of said first and second controlled current generating means inputs.

47. The apparatus of claim 46 wherein there is further provided an offset adjustment means having a pair of inputs each of which is electrically connected to a corresponding one of said first and second controlled current generating means output impedance means, and having an output which is electrically connected to said differential amplifier means, said offset adjustment means being capable of adjusting relative values of currents in said differential amplifier means outputs in response to currents flowing in said first and second controlled current generating means output impedance means.

48. The apparatus of claim 47 wherein said offset adjustment means is formed by a differential transconductance amplifier having an output serving as said offset adjustment means output and having a pair of inputs serving as said offset adjustment means pair of inputs.

49. The apparatus of claim 48 wherein said differential amplifier means input is electrically connected to said amplifier input through a capacitive means with said differential transconductance amplifier output being electrically connected to said differential amplifier means input.

50. An amplifier having an input and a pair of outputs which is operable with a relatively small quiescent current therethrough and with a relatively small voltage drop thereacross, said amplifier comprising:

first and second controlled current generating means each having an input of which one is electrically connected to said amplifier input and each having an output impedance means, said first and second controlled current generating means each being capable, if electrically energized, of providing both substantially constant and variable currents through its said output impedance means of values depending on corresponding values of currents selected to be established through said input thereof;

first and second output controller means each having first and second terminating regions and having a control region therein by which it is capable of being directed, through electrical energization thereof, to effectively provide a conductive path of a selected conductivity between its first and second terminating regions, said first and second output controller means first terminating regions each serving as one of said amplifier outputs, said first output controller means control region and second terminating region being electrically connected across said first controlled current generating means output impedance means and said second output controller means control region and second terminating region being electrically connected across said second controlled current generating means output impedance means;

a differential amplifier means having an input electrically connected to said amplifier input, and having a pair of outputs at which signals are provided having differences in value therebetween that are representative of those differences in values occurring between signals provided to that differential amplifier means input and at least one other selected value, said differential amplifier means outputs each being electrically connected to a corresponding one of said first and second controlled current generating means inputs; and an offset adjustment means formed by a differential transconductance amplifier having a pair of inputs each of which is electrically connected to a corresponding current generating means output impedance means, and having an output which is electrically connected to said differential amplifier means, said offset adjustment means being capable of adjusting relative values of currents in said differential amplifier means outputs in response to differences in currents flowing in said first and second controlled current generating means output impedance means.

51. The apparatus of claim 50 wherein said differential amplifier means input is electrically connected to said amplifier input through a capacitive means with said differential transconductance amplifier output being electrically connected to said differential amplifier means input.

52. The apparatus of claim 51 wherein said first and second controlled current generating means output impedance means each have an independent impedance means separate from one another with each said independent impedance means formed of a pair of series impedance means electrically connected in series with one another at a common node at which a corresponding one of said offset adjustment means inputs is also electrically connected.

* * * * *

UNITED STATES PATENT AND TRADEMARK OFFICE
CERTIFICATE OF CORRECTION

PATENT NO. : 4,973,917

DATED : November 27, 1990

INVENTOR(S) : William A. Johson

It is certified that error appears in the above-identified patent and that said Letters Patent is hereby corrected as shown below:

ON THE TITLE PAGE

In the References Cited Section, under U.S. PATENT DOCUMENTS, insert the following:

```
4,004,247   1/1977   Van de Plassche .  330/30
4,085,382   4/1978   Barber et al   .   330/262
4,216,435   8/1980   Ahmed  . . . . . . 330/254
4,338,527   7/1982   Nagano  . . . . .  307/494
4,442,400   4/1984   Nagano  . . . . .  323/315
4,607,233   8/1986   Van Tuijl . . . .  330/267
4,675,594   6/1987   Reinke  . . . . .  323/317
4,719,430   1/1988   Cole  . . . . . .  330/265
4,758,798   7/1988   Johnson . . . . .  330/293
```

In the References Cited Section, insert the following:

OTHER PUBLICATIONS

Technical Data Sheet No. 500-37-3, LC550 Circuit Amplifier, Linear Technology, Inc., (undated) pp. 1-3.

Col. 24, line 41, delete "claim 13", insert --claim 17--.

UNITED STATES PATENT AND TRADEMARK OFFICE
CERTIFICATE OF CORRECTION

PATENT NO. : 4,973,917

DATED : November 27, 1990

INVENTOR(S) : William A. Johnson

It is certified that error appears in the above-identified patent and that said Letters Patent is hereby corrected as shown below:

Col. 32, lines 5-6, after "corresponding", insert --one of said first and second controlled--.

Signed and Sealed this

Sixteenth Day of June, 1992

Attest:

DOUGLAS B. COMER

Attesting Officer    Acting Commissioner of Patents and Trademarks